(12) United States Patent
Huangfu et al.

(10) Patent No.: US 9,960,210 B2
(45) Date of Patent: May 1, 2018

(54) STRUCTURE OF PIXEL ARRANGEMENT AND DISPLAY DEVICE

(71) Applicant: BOE TECHNOLOGY GROUP CO., LTD., Beijing (CN)

(72) Inventors: Lujiang Huangfu, Beijing (CN); Xiaodan Jin, Beijing (CN); Yinan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 34 days.

(21) Appl. No.: 14/908,838

(22) PCT Filed: Jul. 20, 2015

(86) PCT No.: PCT/CN2015/084440
§ 371 (c)(1),
(2) Date: Jan. 29, 2016

(87) PCT Pub. No.: WO2016/141659
PCT Pub. Date: Sep. 15, 2016

(65) Prior Publication Data
US 2017/0047382 A1  Feb. 16, 2017

(30) Foreign Application Priority Data
Mar. 11, 2015 (CN) .......................... 2015 1 0105698

(51) Int. Cl.
*H01L 29/04* (2006.01)
*H01L 27/32* (2006.01)
*G02F 1/1362* (2006.01)

(52) U.S. Cl.
CPC ........ *H01L 27/3218* (2013.01); *G02F 1/1362* (2013.01); *H01L 27/32* (2013.01);
(Continued)

(58) Field of Classification Search
CPC . H01L 27/3218; H01L 27/3216; H01L 27/32; H01L 27/3211; H01L 27/326
See application file for complete search history.

(56) References Cited

U.S. PATENT DOCUMENTS 7,123,277 B2 * 10/2006 Brown Elliott ....... G06T 3/4015
                                                    345/426
9,099,025 B2 *  8/2015 Jeong ....................... G09G 5/02
(Continued)

FOREIGN PATENT DOCUMENTS

CN     103366683 A    10/2013
CN     103887323 A     6/2014
(Continued)

OTHER PUBLICATIONS

International Search Report dated Dec. 11, 2015 issued in corresponding International Application No. PCT/CN2015/084440 along with English Translation of Written Opinion of the International Searching Authority.
(Continued)

*Primary Examiner* — Shouxiang Hu
(74) *Attorney, Agent, or Firm* — Nath, Goldberg & Meyer; Joshua B. Goldberg; Annie Kock

(57) ABSTRACT

The present invention discloses a structure of pixel arrangement and a display device. The structure of pixel arrangement includes a first sub-pixel, and second sub-pixels and third sub-pixels that are provided surrounding the first sub-pixel, the first sub-pixel, portions of the second sub-pixels and portions of the third sub-pixels constituting a virtual rhombus, wherein a center of the first sub-pixel coincides with a center of the virtual rhombus; a center of the second sub-pixel coincides with a first vertex of the virtual rhombus; and a center of the third sub-pixel coincides with a second vertex of the virtual rhombus. Compared with the prior art, the number of sub-pixels required to achieve
(Continued)

high resolution display in the present invention is smaller, so that the number of the sub-pixels is decreased.

21 Claims, 2 Drawing Sheets

(52) U.S. Cl.
CPC ........ *H01L 27/326* (2013.01); *H01L 27/3211* (2013.01); *H01L 27/3216* (2013.01)

(56) References Cited

U.S. PATENT DOCUMENTS

| | | | |
|---|---|---|---|
| 9,231,033 B2* | 1/2016 | Ahn | .................... H01L 27/3218 |
| 2013/0234917 A1 | 9/2013 | Lee | |
| 2014/0197396 A1* | 7/2014 | Madigan | ............. H01L 51/0005 |
| | | | 257/40 |
| 2015/0015465 A1 | 1/2015 | Gong | |
| 2015/0380471 A1* | 12/2015 | Guo | ......................... G09G 3/20 |
| | | | 345/76 |

FOREIGN PATENT DOCUMENTS

| | | |
|---|---|---|
| CN | 104282230 A | 1/2015 |
| CN | 104681594 A | 6/2015 |
| CN | 204391118 U | 6/2015 |

OTHER PUBLICATIONS

First Office Action dated Feb. 20, 2017 in corresponding Chinese Application No. 201510105698.8.

* cited by examiner

STRUCTURE OF PIXEL ARRANGEMENT AND DISPLAY DEVICE

This is a National Phase Application filed under 35 U.S.C. 371 as a national stage of PCT/CN2015/084440, filed Jul. 20, 2015, an application claiming the benefit of Chinese Application No. 201510105698.8, filed Mar. 11, 2015, the content of each of which is hereby incorporated by reference in its entirety.

FIELD OF THE INVENTION

The present invention relates to the field of display technology, and particularly, to a structure of pixel arrangement and a display device.

BACKGROUND OF THE INVENTION

With applications of high resolution display devices being more and more widely, requirements on a resolution of the display device is increasingly higher. Currently, the resolution of the display device is increased by reducing pixel size and pitch between pixels. However, with refinement of process technology, process difficulty and cost for manufacturing the display device are also increased.

In a display device of the prior art, a pixel is generally consisted of three sub-pixels, e.g., a pixel is consisted of a red sub-pixel R, a green sub-pixel G and a blue sub-pixel B. In a case where a display device requires a large number of pixels to realize high resolution display, the number of required sub-pixels is also large, so that the number of the sub-pixels is increased.

SUMMARY OF THE INVENTION

An object of the present invention is to provide a structure of pixel arrangement and a display device for reducing the number of sub-pixels.

To achieve the above object, an embodiment of the present invention provides a structure of pixel arrangement, which includes a first sub-pixel, and second sub-pixels and third sub-pixels that are provided surrounding the first sub-pixel, the first sub-pixel, portions of the second-sub-pixels and portions of the third sub-pixels constituting a virtual rhombus, wherein a center of the first sub-pixel coincides with a center of the virtual rhombus;

a center of the second sub-pixel coincides with a first vertex of the virtual rhombus; and a center of the third sub-pixel coincides with a second vertex of the virtual rhombus.

Optionally, the virtual rhombus includes a portion of each second sub-pixel of two second sub-pixels, and the two second sub-pixels are spaced apart from each other by the first sub-pixel.

Optionally, in the virtual rhombus, the portion of one second sub-pixel of the two second sub-pixels is provided opposite to the portion of the other second sub-pixel.

Optionally, the virtual rhombus includes a portion of each third sub-pixel of two third sub-pixels, and the two third sub-pixels are spaced apart from each other by the first sub-pixel.

Optionally, in the virtual rhombus, the portion of one third sub-pixel of the two third sub-pixels is provided opposite to the portion of the other third sub-pixel.

Optionally, a first vertex angle of the virtual rhombus corresponding to the first vertex is 60°, and a second vertex angle of the virtual rhombus corresponding to the second vertex is 120°.

Optionally, the virtual rhombus includes a portion of each second sub-pixel of two second sub-pixels, the two second sub-pixels being spaced apart from each other by the first sub-pixel, and the virtual rhombus includes a portion of each third sub-pixel of two third sub-pixels, the two third sub-pixels being spaced apart from each other by the first sub-pixel, wherein a first vertex angle of the virtual rhombus corresponding to the first vertex is 600, and a second vertex angle of the virtual rhombus corresponding to the second vertex is 120°.

Optionally, a shape of the first sub-pixel is a quadrilateral, a shape of the second sub-pixel is a hexagon, and a shape of the third sub-pixel is a triangle.

Optionally, a shape of the first sub-pixel is a quadrilateral that is surrounded by two lines perpendicular to lines connecting a center of the first sub-pixel with centers of the second sub-pixels adjacent to the first sub-pixel and two lines perpendicular to lines connecting the center of the first sub-pixel with centers of the third sub-pixels adjacent to the first sub-pixel;

a shape of the second sub-pixel is a hexagon that is surrounded by six lines each perpendicular to a line connecting a center of the second sub-pixel with a center of the respective first sub-pixel adjacent to the second sub-pixel; and a shape of the third sub-pixel is a triangle that is surrounded by three lines each perpendicular to a line connecting a center of the third sub-pixel with a center of the respective first sub-pixel adjacent to the third sub-pixel.

Optionally, the shape of the first sub-pixel is a rectangle, the shape of the second sub-pixel is a regular hexagon, and the shape of the third sub-pixel is a regular triangle.

Optionally, area ratios of the portions of the two second sub-pixels included in the virtual rhombus to the respective second sub-pixels are identical, and area ratios of the portions of the two third sub-pixels included in the virtual rhombus to the respective third sub-pixels are identical.

Optionally, the ratio of the area of the portion of each second sub-pixel of the two second sub-pixels included in each virtual rhombus to the area of the respective second sub-pixel is ⅙, and the ratio of the area of the portion of each third sub-pixel of the two third sub-pixels included in each virtual rhombus to the area of the respective third sub-pixel is ⅓.

Optionally, a ratio of the number of the first sub-pixels, the number of the second sub-pixels and the number of the third sub-pixels in the structure of pixel arrangement is 3:1:2.

Optionally, the first sub-pixel is a green sub-pixel, the second sub-pixel is a blue sub-pixel, and the third sub-pixel is a red sub-pixel.

Optionally, the first sub-pixels, the second sub-pixels and the third sub-pixels are arranged in a compact arrangement manner.

Optionally, three adjacent virtual rhombuses constitute a pixel group, and extending directions of long diagonals of the three virtual rhombuses included in the pixel group coincide with a first direction, a second direction and a third direction that are different with each other, respectively.

Optionally, the first direction is a horizontal direction, the second and third directions are provided intersecting with the first direction at different intersection points, and the second and third directions are provided intersecting with each other.

Optionally, the long diagonals of the three virtual rhombuses included in the pixel group are connected to form a regular triangle.

Optionally, any two virtual rhombuses of the three virtual rhombuses included in the pixel group share a side.

Optionally, adjacent pixel groups share a side.

Optionally, adjacent two second sub-pixels in one row are spaced apart from each other by a first sub-pixel, distances between centers of every adjacent two second sub-pixels in one row are identical, and a center of each one of second sub-pixels in one row is located at a perpendicular bisector of a line connecting centers of two second sub-pixels located in a different row and nearest to the one second sub-pixel.

Optionally, adjacent two first sub-pixels in one row are spaced apart from each other by a second sub-pixel, adjacent two first sub-pixels in a row adjacent to the one row are spaced apart from each other by a third sub-pixel, distances between centers of every adjacent two first sub-pixels in one row are identical, and each of centers of the first sub-pixels spaced by the second sub-pixel is located at a perpendicular bisector of a line connecting centers of two first sub-pixels adjacent to the first sub-pixel and spaced by the third sub-pixel.

Optionally, adjacent two third sub-pixels in one row are spaced apart from each other by a first sub-pixel, distances between centers of every adjacent two third sub-pixels in one row are identical, and a center of each one of third sub-pixels in one row is located at a perpendicular bisector of a line connecting centers of two second sub-pixels nearest to the one third sub-pixel in a row of second sub-pixels adjacent to the one row of the third sub-pixels.

Optionally, each of the second sub-pixels is surrounded by six of the first sub-pixels, each of the third sub-pixels is surrounded by three of the first sub-pixels, and each of the first sub-pixels is surrounded by two of the second sub-pixels and two of the third sub-pixels.

To achieve the above object, an embodiment of the present invention further provides a display device, which includes the above structure of pixel arrangement.

The beneficial effects of the present invention are as below.

According to the structure of pixel arrangement and the display device provided by embodiments of the present invention, the structure of pixel arrangement includes a first sub-pixel, and second sub-pixels and third sub-pixels that are provided surrounding the first sub-pixel, the first sub-pixel, portions of the second sub-pixels and portions of the third sub-pixels constituting a virtual rhombus, wherein a center of the first sub-pixel coincides with a center of the virtual rhombus; a center of the second sub-pixel coincides with a first vertex of the virtual rhombus; and a center of the third sub-pixel coincides with a second vertex of the virtual rhombus. Compared with the prior art, the number of sub-pixels required to achieve high resolution display in the present invention is smaller, so that the number of the sub-pixels required in a high resolution display device is decreased.

DETAILED DESCRIPTION OF THE EMBODIMENTS

To make those skilled in the art better understand the technical solutions of the present invention, a structure of pixel arrangement and a display device provided by embodiments of the present invention will be described below in details in conjunction with the accompanying drawings.

Embodiment 1

Figure 1:
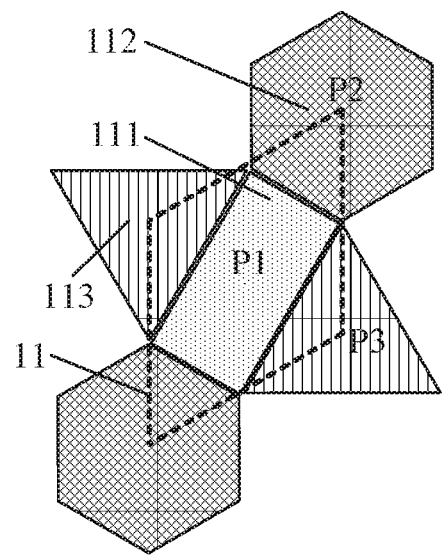
FIG. 1 is a schematic diagram of a structure of pixel arrangement provided by Embodiment 1 of the present invention.

FIG. 1 is a schematic diagram of a structure of pixel arrangement provided by Embodiment 1 of the present invention. As shown in FIG. 1, the structure of pixel arrangement includes a first sub-pixel 111, and second sub-pixels 112 and third sub-pixels 113 that are provided surrounding the first sub-pixel 111. The first sub-pixel 111, portions of the second sub-pixels 112 and portions of the third sub-pixels 113 constitute a virtual rhombus, as indicated by an area surrounded by dotted lines in FIG. 1. A center of the first sub-pixel 111 coincides with a center P1 of the virtual rhombus, a center of the second sub-pixel 112 coincides with a first vertex P2 of the virtual rhombus, and a center of the third sub-pixel 113 coincides with a second vertex P3 of the virtual rhombus.

The structure of pixel arrangement in the present embodiment includes repeatedly arranged virtual rhombuses. Compared with the prior art, the number of sub-pixels required to achieve high resolution display in the present embodiment is smaller, so that the number of the sub-pixels is decreased.

In the present embodiment, as shown in FIG. 1, the virtual rhombus includes a portion of each second sub-pixel 112 of two second sub-pixels 112, and the two second sub-pixels 112 are spaced apart from each other by the first sub-pixel 111. Preferably, in the virtual rhombus, the portion of one second sub-pixel 112 of the two second sub-pixels 112 is provided opposite to the portion of the other second sub-pixel 112.

In the present embodiment, the virtual rhombus includes a portion of each third sub-pixel 113 of two third sub-pixels 113, and the two third sub-pixels 113 are spaced apart from each other by the first sub-pixel 111. Preferably, in the virtual rhombus, the portion of one third sub-pixel 113 of the two third sub-pixels 113 is provided opposite to the portion of the other third sub-pixel 113.

Preferably, a first vertex angle of the virtual rhombus corresponding to the first vertex P2 is 60°, and a second vertex angle of the virtual rhombus corresponding to the second vertex P3 is 120°.

In the present embodiment, a shape of the first sub-pixel 111 is a quadrilateral, a shape of the second sub-pixel 112 is a hexagon, and a shape of the third sub-pixel 113 is a triangle. Preferably, the shape of the first sub-pixel 111 is a rectangle, the shape of the second sub-pixel 112 is a regular hexagon, and the shape of the third sub-pixel 113 is a regular triangle. In practical applications, the shapes of the first sub-pixel 111, the second sub-pixel 112 and the third sub-pixel 113 may be other shapes, e.g., nonstandard forms of the above polygons (for example, provided that the above polygons having a chamfer at each vertex thereof, so as to lowering the manufacturing difficulty of a mask for forming the structure of pixel arrangement), or a circle, or the like.

In the present embodiment, area ratios of the portions of the two second sub-pixels 112 included in the virtual rhombus to the respective second sub-pixels 112 are identical, and area ratios of the portions of the two third sub-pixels 113 included in the virtual rhombus to the respective third sub-pixels 113 are identical. Preferably, the ratio of the area of the portion of each second sub-pixel 112 of the two second sub-pixel 112 included in each virtual rhombus to the area of the respective second sub-pixel 112 is ⅙, and the ratio of the area of the portion of each third sub-pixel 113 of the two third sub-pixel 113 included in each virtual rhombus to the area of the respective third sub-pixel 113 is ⅓. Accordingly, a ratio of the number of the first sub-pixels 111, the number of the second sub-pixels 112 and the number of the third sub-pixels 113 in the structure of pixel arrangement is 3:1:2.

Preferably, the first sub-pixel 111 is a green sub-pixel, the second sub-pixel 112 is a blue sub-pixel, and the third sub-pixel 113 is a red sub-pixel. Center of the green sub-pixel is located at the center P1 of the virtual rhombus, centers of the two blue sub-pixels are located at the first vertexes P1 corresponding to the first vertex angles of the virtual rhombus, respectively, and centers of the two red sub-pixels are located at the second vertexes P2 corresponding to the second vertex angles of the virtual rhombus, respectively. As the position resolutions of the red sub-pixel and blue sub-pixel are lower than that of the green sub-pixel, the red sub-pixel and blue sub-pixel that are not sensitive to the position resolution are shared between pixels in the present embodiment, so that a better pixel resolution can be realized by imitation using a relatively small number of sub-pixels.

Figure 2:
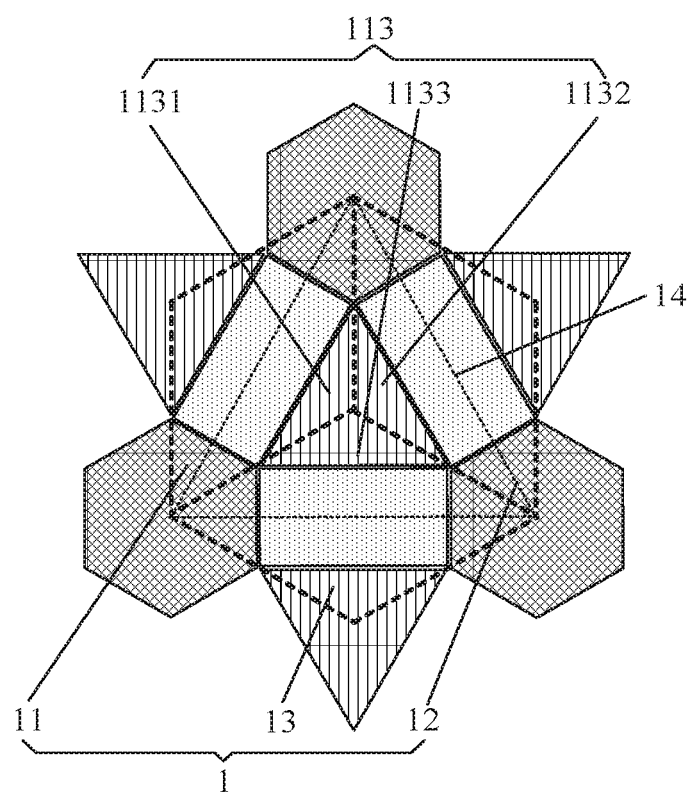
FIG. 2 is a schematic diagram of a structure of pixel group constituted by virtual rhombuses of FIG. 1.

FIG. 2 is a schematic diagram of a structure of a pixel group constituted by virtual rhombuses of FIG. 1. As shown in FIG. 2, three adjacent virtual rhombuses constitute a pixel group 1, and extending directions of long diagonals of the three virtual rhombuses included in the pixel group 1 coincide with a first direction, a second direction and a third direction that are different with each other, respectively. The three adjacent virtual rhombuses are a virtual rhombus 11, a virtual rhombus 12 and a virtual rhombus 13, respectively. The extending direction of the long diagonal of the virtual rhombus 13 coincides with the first direction, the extending direction of the long diagonal of the virtual rhombus 11 coincides with the second direction, and the extending direction of the long diagonal of the virtual rhombus 12 coincides with the third direction. For example, the first direction is a horizontal direction, the second and third directions are provided intersecting with the first direction at different intersection points, and the second and third directions are provided intersecting with each other. In the present embodiment, the long diagonals of the three virtual rhombuses included in the pixel group 1 are connected to form a regular triangle, i.e., the long diagonals of the three virtual rhombuses 11, 12 and 13 are connected to form a regular triangle 14.

In the present embodiment, any two virtual rhombuses of the three virtual rhombuses included in the pixel group 1 share a side. Specifically, the virtual rhombus 11 shares a side with the virtual rhombus 12, the virtual rhombus 11 shares a side with the virtual rhombus 13, and the virtual rhombus 12 shares a side with the virtual rhombus 13, i.e., the virtual rhombuses are arranged in a compact arrangement manner.

Figure 3:
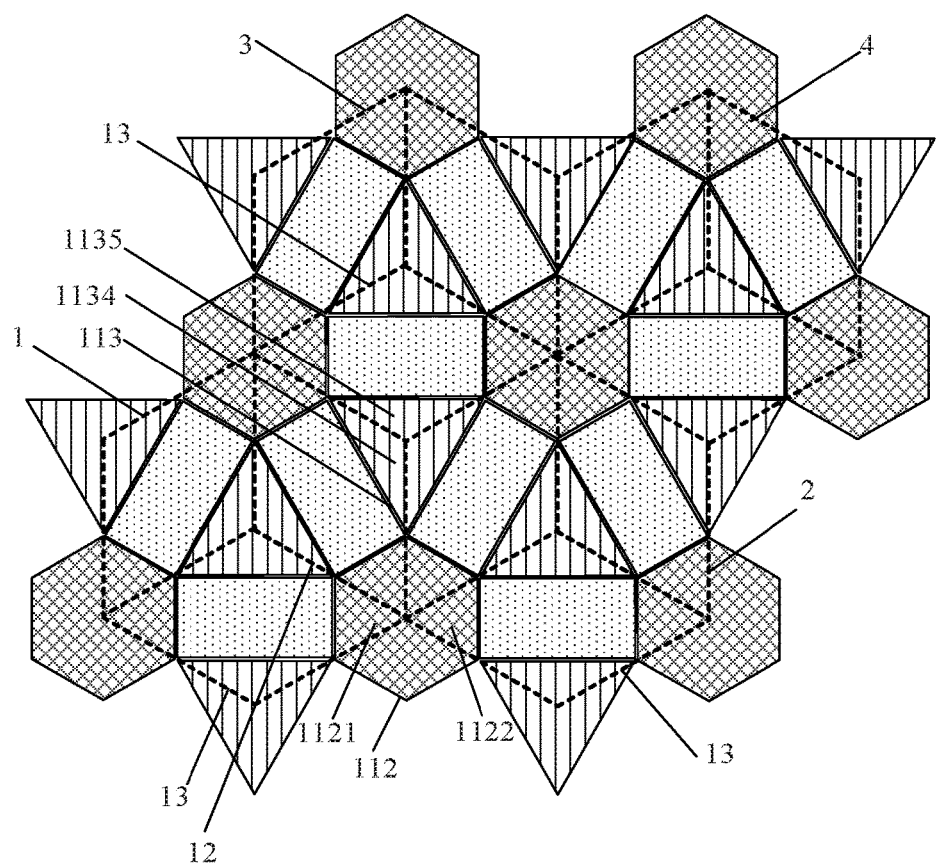
FIG. 3 is schematic diagram of an arrangement of pixel groups of FIG. 2.

FIG. 3 is a schematic diagram of an arrangement of pixel groups of FIG. 2. As shown in FIG. 3, the pixel groups are repeatedly arranged, and the pixel groups are provided extending side by side. For example, the pixel groups are provided extending in a horizontal direction. The adjacent pixel groups share a side, and in this embodiment, any two pixel groups of adjacent three pixel groups share a side. FIG. 3 shows four groups including a pixel group 1, a pixel group 2, a pixel group 3 and a pixel group 4, in which the structures of the pixel group 2, 3 and 4 are the same as that of the pixel group 1. The pixel groups 1, 2, 3 and 4 are repeatedly arranged, in which the pixel group 2 is located on a right of the pixel group 1, the pixel group 3 is located on an upper-right of the pixel group 1, and the pixel group 4 is located on a right of the pixel group 3. The pixel groups 1 and 2 are arranged side by side, and the pixel groups 3 and 4 are arranged side by side. Any two pixel groups of the adjacent pixel groups 1, 2 and 3 share a side.

Taking the pixel group 1 as an example, the virtual rhombus 11 includes a portion 1131 of the third sub-pixel 113 located at the center of the pixel group 1, the virtual rhombus 12 includes a portion 1132 of the third sub-pixel 113 located at the center of the pixel group 1, and the virtual rhombus 13 includes a portion 1133 of the third sub-pixel 113 located at the center of the pixel group 1. Taking the pixel groups 1 and 2 as an example, the virtual rhombus 13 included in the pixel group 1 includes a portion 1121 of the second sub-pixel 112, and the virtual rhombus 13 included in the adjacent pixel group 2 includes a portion 1122 of the second sub-pixel 112. Taking the pixel groups 1 and 3 as an example, the virtual rhombus 12 included in the pixel group 1 includes a portion 1134 of the third sub-pixel 113, and the virtual rhombus 13 included in the pixel group 3 includes a portion 1135 of the third sub-pixel 113.

In this embodiment, as shown in FIG. 3, the shape of the first sub-pixel 111 is a quadrilateral that is surrounded by two lines perpendicular to lines connecting a center of the first sub-pixel 111 with centers of the second sub-pixels 112 adjacent to the first sub-pixel 111 and two lines perpendicular to lines connecting the center of the first sub-pixel 111 with centers of the third sub-pixels 113 adjacent to the first sub-pixel 111; the shape of the second sub-pixel 112 is a hexagon that is surrounded by six lines each perpendicular to a line connecting a center of the second sub-pixel 112 with a center of the respective first sub-pixel 111 adjacent to the second sub-pixel 112; and the shape of the third sub-pixel 113 is a triangle that is surrounded by three lines each perpendicular to a line connecting a center of the third sub-pixel 113 with a center of the respective first sub-pixel 111 adjacent to the third sub-pixel 113.

In the present embodiment, as shown in FIG. 3, adjacent two second sub-pixels 112 in one row are spaced apart from each other by a first sub-pixel 111, distances between centers of every adjacent two second sub-pixels 112 in one row are identical, and a center of each one of second sub-pixels 112 in one row is located at a perpendicular bisector of a line connecting centers of two second sub-pixels 112 located in a different row and nearest to the one second sub-pixel 112.

In the present embodiment, as shown in FIG. 3, adjacent two first sub-pixels 111 in one row are spaced apart from each other by a second sub-pixel 112, adjacent two first sub-pixels 111 in a row adjacent to the one row are spaced apart from each other by a third sub-pixel 113, distances between centers of every adjacent two first sub-pixels 111 in one row are identical, and each of centers of the first sub-pixels 111 spaced by the second sub-pixel 112 is located at a perpendicular bisector of a line connecting centers of two first sub-pixel 111 which are spaced by the third sub-pixel 113 and adjacent to the first sub-pixel 111.

In this embodiment, as shown in FIG. 3, adjacent two third sub-pixels 113 in one row are spaced apart from each other by a first sub-pixel 111, distances between centers of every adjacent two third sub-pixels 113 in one row are identical, and a center of each one of third sub-pixel 113 in one row is located at a perpendicular bisector of a line connecting centers of two second sub-pixels 112 nearest to the one third sub-pixel 113 in a row of second sub-pixels 112 adjacent to the one row of the third sub-pixels 113.

In this embodiment, each of the second sub-pixels 112 is surrounded by six of the first sub-pixels 111, each of the third sub-pixels 113 is surrounded by three of the first sub-pixels 111, and each of the first sub-pixels 111 is surrounded by two of the second sub-pixels 112 and two of the third sub-pixels 113.

As the ratio of the number of the first sub-pixels 111, the number of the second sub-pixels 112 and the number of the third sub-pixels 113 in the structure of pixel arrangement is 3:1:2, in a case where the first sub-pixel 111 is a green sub-pixel, the second sub-pixel 112 is a blue sub-pixel and the third sub-pixel 113 is a red sub-pixel, the ratio of the number of the red sub-pixels, the number of the green sub-pixels and the number of the blue sub-pixels in the structure of pixel arrangement is 2:3:1. Compared with the PenTile technique in which the ratio of the number of red sub-pixels, the number of green sub-pixels and the number of blue sub-pixels in a structure of pixel arrangement is 1:2:1, the ratio of the numbers of sub-pixels in different colors in the present embodiment is more in line with the ratio of numbers of recognition bodies in different colors in the human eye's retina, so that the performance realized by pixels formed by the sub-pixels sharing technology is more close to the performance realized by pixels formed by sub-pixels of three primaries of red, green and blue.

In this embodiment, the ratio of the number of the first sub-pixels 111, the number of the second sub-pixels 112 and the number of the third sub-pixels 113 in the structure of pixel arrangement is 3:1:2, and the pixel group includes three virtual rhombuses, in which each of the virtual rhombuses includes 1/6 of each second sub-pixel 112 of the two second sub-pixels 112, and each of the virtual rhombuses includes 1/3 of each third sub-pixel 113 of the two third sub-pixels 113. That is, one virtual rhombus occupies one first sub-pixel 111, 1/3 of the second sub-pixel 112 and 2/3 of the third sub-pixel 113. Thus, it can be considered that one pixel is constituted by two sub-pixels in the present embodiment, i.e., the number of the sub-pixels is twice as large as that of the pixels. Compared with the prior art in which three sub-pixels constitute one pixel and the number of the sub-pixels is three times as large as that of the pixels, the number of the sub-pixels is decreased in the present embodiment.

In the present embodiment, the sub-pixels are arranged in a compact arrangement manner to form a display area. The meaning of arranging the first sub-pixels 111, the second sub-pixels 112 and the third sub-pixels 113 in the compact arrangement manner is that there is no overlapped area or gap among the first sub-pixels 111, the second sub-pixels 112 and the third sub-pixels 113. In a case where the compact arrangement manner is adopted, adjacent virtual rhombuses share the vertexes, i.e., different virtual rhombuses share the second vertex P2 and the third vertex P3 to realize the compact arrangement. In the present embodiment, the distribution of the sub-pixels can be uniform by adopting the compact arrangement, so that the display performance of a display device can be improved.

The structure of pixel arrangement provided by the present embodiment includes a first sub-pixel, and second sub-pixels and third sub-pixels that are provided surrounding the first sub-pixel, the first sub-pixel, portions of the second sub-pixels and portions of the third sub-pixels constituting a virtual rhombus, wherein a center of the first sub-pixel coincides with a center of the virtual rhombus; a center of the second sub-pixel coincides with a first vertex of the virtual rhombus; and a center of the third sub-pixel coincides with a second vertex of the virtual rhombus. Compared with the prior art, the number of sub-pixels required to achieve high resolution display in the present invention is smaller, so that the number of the sub-pixels is decreased. Using a smaller number of sub-pixels, the manufacturing difficulty thereof is lowered, the yield of products is improved and the manufacturing cost is decreased.

Embodiment 2

Embodiment 2 of the present invention provides a display device, which includes the structure of pixel arrangement provided by Embodiment 1, details of which will not be redundantly described herein. The display device may be an OLED display panel, a mobile phone, a flat television, or the like, and it is not limited herein.

According to the display device provided by the present embodiment, the structure of pixel arrangement includes a first sub-pixel, and second sub-pixels and third sub-pixels that are provided surrounding the first sub-pixel, the first sub-pixel, portions of the second-sub-pixels and portions of the third sub-pixels constituting a virtual rhombus, wherein a center of the first sub-pixel coincides with a center of the virtual rhombus; a center of the second sub-pixel coincides with a first vertex of the virtual rhombus; and a center of the third sub-pixel coincides with a second vertex of the virtual rhombus. Compared with the prior art, the number of sub-pixels required to achieve high resolution display in the present invention is smaller, so that the number of the sub-pixels is decreased. Using a smaller number of sub-pixels, the manufacturing difficulty thereof is lowered, the yield of products is improved and the manufacturing cost is decreased.

What is claimed is:

1. A structure of pixel arrangement comprising a plurality of subpixels, which comprises first sub-pixels having a first color, second sub-pixels having a second color, and third sub-pixels having a third color, the plurality of sub-pixels being divided into a plurality of virtual rhombuses arranged side by side and having a same shape, each of the plurality of virtual rhombuses being configured to be used as a single pixel, wherein each of the plurality of virtual rhombuses includes one of the first sub-pixels, a portion of each of two of the second sub-pixels which are spaced apart from each other by the one first sub-pixel, and a portion of each of two of the third sub-pixels which are spaced apart from each other by the one first sub-pixel;

a center of the one first sub-pixel coincides with a center of a corresponding one of the plurality of virtual rhombuses;

centers of the two second sub-pixels coincide with two first vertexes of the corresponding one of the plurality of virtual rhombuses, respectively; and centers of the two third sub-pixels coincide with two second vertexes of the corresponding one of the plurality of rhombuses, respectively, wherein a shape of the first sub-pixel is a quadrilateral, a shape of the second sub-pixel is a hexagon, and a shape of the third sub-pixel is a triangle.

2. The structure of pixel arrangement according to claim 1, wherein, in each of the virtual rhombuses, the portion of one second sub-pixel of the two second subpixels is provided opposite to the portion of the other second sub-pixel.

3. The structure of pixel arrangement according to claim 1, wherein, in each of the virtual rhombuses, the portion of one third sub-pixel of the two third sub-pixels is provided opposite to the portion of the other third sub-pixel.

4. The structure of pixel arrangement according to claim 1, wherein, in each of the virtual rhombuses, a first vertex angle corresponding to the first vertex is 60°, and a second vertex angle corresponding to the second vertex is 120°.

5. The structure of pixel arrangement according to claim 1, wherein the first sub-pixel is surrounded by two lines perpendicular to lines connecting a center of the first sub-pixel with centers of the second sub-pixels adjacent to the first sub-pixel and two lines perpendicular to lines connecting the center of the first sub-pixel with centers of the third sub-pixels adjacent to the first sub-pixel;
the second sub-pixel is surrounded by six lines each perpendicular to a line connecting a center of the second sub-pixel with a center of the respective first sub-pixel adjacent to the second sub-pixel; and
the third sub-pixel is surrounded by three lines each perpendicular to a line connecting a center of the third sub-pixel with a center of the respective first sub-pixel adjacent to the third sub-pixel.

6. The structure of pixel arrangement according to claim 1, wherein the shape of the first sub-pixel is a rectangle, the shape of the second sub-pixel is a regular hexagon, and the shape of the third sub-pixel is a regular triangle.

7. The structure of pixel arrangement according to claim 6, wherein area ratios of the portions of the two second sub-pixels included in each of the virtual rhombuses to the respective second sub-pixels are identical, and area ratios of the portions of the two third sub-pixels included in each of the virtual rhombuses to the respective third sub-pixels are identical.

8. The structure of pixel arrangement according to claim 7, wherein the ratio of the area of the portion of each second sub-pixel of the two second sub-pixels included in each of the virtual rhombuses to the area of the respective second sub-pixel is ⅙, and the ratio of the area of the portion of each third sub-pixel of the two third sub-pixels included in each of the virtual rhombuses to the area of the respective third sub-pixel is ⅓.

9. The structure of pixel arrangement according to claim 8, wherein a ratio of the number of the first sub-pixels, the number of the second sub-pixels and the number of the third sub-pixels in the structure of pixel arrangement is 3:1:2.

10. The structure of pixel arrangement according to claim 1, wherein the first sub-pixel is a green sub-pixel, the second sub-pixel is a blue sub-pixel, and the third sub-pixel is a red sub-pixel.

11. The structure of pixel arrangement according to claim 1, wherein the first sub-pixels, the second sub-pixels and the third sub-pixels are arranged in a compact arrangement manner.

12. The structure of pixel arrangement according to claim 1, wherein three adjacent virtual rhombuses constitute a pixel group, and extending directions of long diagonals of the three virtual rhombuses included in the pixel group coincide with a first direction, a second direction and a third direction that are different with each other, respectively.

13. The structure of pixel arrangement according to claim 12, wherein the first direction is a horizontal direction, the second and third directions are provided intersecting with the first direction at different intersection points, and the second and third directions are provided intersecting with each other.

14. The structure of pixel arrangement according to claim 13, wherein the long diagonals of the three virtual rhombuses included in the pixel group are connected to form a regular triangle.

15. The structure of pixel arrangement according to claim 12, wherein any two virtual rhombuses of the three virtual rhombuses included in the pixel group share a side.

16. The structure of pixel arrangement according to claim 12, wherein adjacent pixel groups share a side.

17. The structure of pixel arrangement according to claim 1, wherein adjacent two of the second sub-pixels in one row are spaced apart from each other by one of the first sub-pixels, distances between centers of every adjacent two of the second sub-pixels in one row are identical, and a center of each one of the second sub-pixels in one row is located at a perpendicular bisector of a line connecting centers of two of the second sub-pixels located in a different row and nearest to the one second sub-pixel.

18. The structure of pixel arrangement according to claim 1, wherein adjacent two of the first sub-pixels in one row are spaced apart from each other by one of the second sub-pixels, adjacent two of the first sub-pixels in a row adjacent to the one row are spaced apart from each other by one of the third sub-pixels, distances between centers of every adjacent two of the first sub-pixels in one row are identical, and each of centers of the first sub-pixels spaced by the second subpixel is located at a perpendicular bisector of a line connecting centers of the two first sub-pixels adjacent to the first sub-pixel and spaced by the third sub-pixel.

19. The structure of pixel arrangement according to claim 1, wherein adjacent two of the third sub-pixels in one row are spaced apart from each other by one of the first subpixels, distances between centers of every adjacent two of the third sub-pixels in one row are identical, and a center of each one of the third sub-pixels in one row is located at a perpendicular bisector of a line connecting centers of two of the second sub-pixels nearest to the one third sub-pixel in a row of second sub-pixels adjacent to the one row of the third sub-pixels.

20. The structure of pixel arrangement according to claim 1, wherein each of the second sub-pixels is surrounded by six of the first sub-pixels, each of the third sub-pixels is surrounded by three of the first sub-pixels, and each of the first sub-pixels is surrounded by two of the second sub-pixels and two of the third sub-pixels.

21. A display device, which includes the structure of pixel arrangement according to claim 1.

* * * * *